(12) United States Patent
Kim et al.

(10) Patent No.: US 12,062,733 B2
(45) Date of Patent: Aug. 13, 2024

(54) SUBSTRATE FOR SOLAR CELL, SOLAR CELL, AND SOLAR CELL MANUFACTURING METHOD

(71) Applicant: JUSUNG ENGINEERING CO., LTD., Gwangju-si (KR)

(72) Inventors: JungBae Kim, Gwangju-si (KR); JunYoung Kang, Gwangju-si (KR); HyangJu Mun, Gwangju-si (KR); SeonKi Min, Gwangju-si (KR); JeongHo Seo, Gwangju-si (KR); WonSuk Shin, Gwangju-si (KR); HyunKyo Shin, Gwangju-si (KR); YoungTae Yoon, Gwangju-si (KR); KyoungJin Lim, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 31 days.

(21) Appl. No.: 17/438,415

(22) PCT Filed: Apr. 7, 2020

(86) PCT No.: PCT/KR2020/004683
§ 371 (c)(1),
(2) Date: Sep. 10, 2021

(87) PCT Pub. No.: WO2020/246697
PCT Pub. Date: Dec. 10, 2020

(65) Prior Publication Data
US 2022/0149227 A1    May 12, 2022

(30) Foreign Application Priority Data

Jun. 4, 2019 (KR) .................. 10-2019-0065829
Sep. 30, 2019 (KR) .................. 10-2019-0120384

(51) Int. Cl.
*H01L 31/18* (2006.01)
*H01L 31/0463* (2014.01)

(52) U.S. Cl.
CPC ...... *H01L 31/1896* (2013.01); *H01L 31/0463* (2014.12)

(58) Field of Classification Search
CPC ............ B23K 2101/40; B23K 2103/56; B23K 26/364; B23K 26/402; H01L 21/78;
(Continued)

(56) References Cited

U.S. PATENT DOCUMENTS

2003/0180983 A1\* 9/2003 Oswald .................. H01L 31/18
438/57
2005/0070059 A1\* 3/2005 Blakers ............... H01L 31/0682
438/200
(Continued)

FOREIGN PATENT DOCUMENTS

CN       102299197 A       12/2011
CN       103229311 A        7/2013
(Continued)

OTHER PUBLICATIONS

KR 10-2018-0076197 A translation provided by FIT database.\*

*Primary Examiner* — Golam Mowla
(74) *Attorney, Agent, or Firm* — Renaissance IP Law Group LLP

(57) ABSTRACT

The present invention relates to a solar cell manufacturing method, a solar cell manufactured thereby, and a substrate for a solar cell. The solar cell manufacturing method involves forming a separating portion for separating a substrate, which is for manufacturing the solar cell, into a plurality of pieces. The solar cell manufacturing method comprises: a step for preparing the substrate; a first substrate etching step for forming a first groove in one surface of the substrate; a second substrate etching step for forming a
(Continued)

second groove inside the first groove; and a third substrate etching step for etching the substrate including the second groove, wherein the separating portion includes the first groove and the second groove.

13 Claims, 13 Drawing Sheets

(58) Field of Classification Search
CPC . H01L 31/0445; H01L 31/0463; H01L 31/18; H01L 31/1896
See application file for complete search history.

(56) References Cited

U.S. PATENT DOCUMENTS

| | | | |
|---|---|---|---|
| 2007/0232057 A1* | 10/2007 | Borden | ............... H01L 31/0322 438/622 |
| 2007/0238285 A1* | 10/2007 | Borden | ............... H01L 31/0463 438/618 |
| 2009/0283127 A1 | 11/2009 | Juso et al. | |
| 2011/0124147 A1 | 5/2011 | Mayerhofer | |
| 2011/0135265 A1 | 6/2011 | Park et al. | |
| 2012/0000506 A1* | 1/2012 | Nam | ........................ H01L 31/18 257/E31.124 |
| 2012/0048330 A1* | 3/2012 | Son | ..................... H01L 31/0465 257/E31.127 |
| 2013/0019935 A1* | 1/2013 | Kim | ..................... H01L 31/0463 257/E31.124 |
| 2014/0273329 A1 | 9/2014 | Yang et al. | |

FOREIGN PATENT DOCUMENTS

| | | |
|---|---|---|
| CN | 107689402 A | 2/2018 |
| JP | H0613461 A | 1/1994 |
| JP | 2001127010 A | 5/2001 |
| JP | 2001250800 A | 9/2001 |
| JP | 2005236017 A | 9/2005 |
| JP | 2006041263 A | 2/2006 |
| JP | 2007042739 A | 2/2007 |
| JP | 2011253909 A | 12/2011 |
| JP | 2014017447 A | 1/2014 |
| KR | 20020061291 A | 7/2002 |
| KR | 20110064460 A | 6/2011 |
| KR | 20110110900 A | 10/2011 |
| KR | 20180076197 A | 7/2018 |
| TW | 200742101 A | 11/2007 |
| TW | 200952200 A | 12/2009 |
| WO | 2013031978 A1 | 3/2013 |
| WO | 2017136672 A1 | 8/2017 |

* cited by examiner

SUBSTRATE FOR SOLAR CELL, SOLAR CELL, AND SOLAR CELL MANUFACTURING METHOD

TECHNICAL FIELD

The present invention relates to a solar cell and relates to a solar cell where a wafer type solar cell is combined with a thin film type solar cell.

BACKGROUND ART

Solar cells are devices that convert light energy into electrical energy, based on a characteristic of a semiconductor.

The solar cells have a PN junction structure where a positive (P)-type semiconductor and a negative (N)-type semiconductor are joined to each other. When sunlight is incident on a solar cell having the PN junction structure, a hole and an electron are generated in the semiconductors by energy of the incident sunlight. At this time, due to an electric field which is generated in a PN junction, the hole (+) moves to the P-type semiconductor, and the electron (−) moves to the N-type semiconductor, thereby generating an electric potential to produce power.

The solar cells may be categorized into thin film type solar cells and wafer type solar cells.

The wafer type solar cells are solar cells which are manufactured by using, as a substrate, a semiconductor material such as a silicon wafer, and the thin film type solar cells are solar cells which are manufactured by forming, as a thin film type, a semiconductor on a substrate such as glass.

The wafer type solar cells have an advantage which is better in efficiency than the thin film type solar cells, but the thin film type solar cells have an advantage where the manufacturing cost is reduced compared to the wafer type solar cells.

Therefore, a solar cell where the wafer type solar cell is combined with the thin film type solar cell has been proposed. Hereinafter, a related art solar cell will be described with reference to the drawing.

FIGS. 1A to 1C are schematic process side views illustrating a method of manufacturing a solar cell according to the related art.

First, as illustrated in FIG. 1A, a substrate 100 is prepared. Here, the substrate 100 may be selected one of a silicon wafer and glass.

Subsequently, as illustrated in FIG. 1B, a cell manufacturing process is performed by forming a plurality of thin film layers 200 on the substrate 100. Each of the plurality of thin film layers 200 may be one layer selected from among a semiconductor layer and a conductive layer.

Subsequently, as illustrated in FIG. 1C, a division part 300 for dividing a cell, where the plurality of thin film layers 200 are formed, into unit cells is formed. The division part 300 may be formed by a scribing process using a laser. The scribing process may be performed by a scribing apparatus 300a which irradiates a laser beam onto the cell.

Here, the method of manufacturing the solar cell according to the related art is implemented so that a plurality of thin film layers are formed on the substrate 100, and then, the scribing process is performed. Therefore, the method of manufacturing the solar cell according to the related art has the following problems.

First, the method of manufacturing the solar cell according to the related art is implemented so that the plurality of thin film layers 200 are bonded to each other at a portion onto which a laser is irradiated by performing the scribing process. Due to this, in the method of manufacturing the solar cell according to the related art, a layer short phenomenon which hinders movements of the hole (+) and the electron (−) between the plurality of thin film layers 200 occurs, causing a problem where the amount of power capable of being generated by the solar cell is reduced.

Second, the method of manufacturing the solar cell according to the related art is implemented so that a particle 400 and a crack 500 are formed in a cell by performing the scribing process. Due to this, the method of manufacturing the solar cell according to the related art has a problem where the quality of a finished solar cell is degraded by the particle 400 and the crack 500.

DISCLOSURE

Technical Problem

The present invention is devised to solve the above-described problems and relates to a solar cell and a method of manufacturing the solar cell, which may decrease the possibility of occurrence of a layer short phenomenon.

The present invention relates to a solar cell and a method of manufacturing the solar cell, which may decrease the degree of reduction in quality of a finished solar cell caused by a particle and a crack formed in a substrate.

Technical Solution

The present invention may include the following elements, for solving the above-described technical problem.

A method of manufacturing a solar cell according to the present invention is to form a division part for dividing a substrate, which is for manufacturing the solar cell, into a plurality of pieces and may include: a process of preparing the substrate; a first substrate etching process of forming a first groove in one surface of the substrate; a second substrate etching process of forming a second groove in the first groove; and a third substrate etching process of etching the substrate including the second groove. The division part may include the first groove and the second groove.

A method of manufacturing a solar cell according to the present invention may include: a process of preparing a substrate where a substrate division part including a first groove formed in one surface of the substrate in a first direction and a second groove formed in the first groove in the first direction is formed; and a process of forming a thin film on the substrate with the substrate division part formed therein.

A method of manufacturing a solar cell according to the present invention may include a substrate preparing process of preparing a substrate where a plurality of in-line groove portions are formed in a top surface thereof, a process of forming a cell of a solar cell on the substrate, and a division process of dividing the substrate along the plurality of in-line groove portions. Each of the plurality of in-line groove portions may be a substrate division part for dividing the substrate into a plurality of pieces.

A method of manufacturing a solar cell according to the present invention may include a substrate preparing process of preparing a substrate where a plurality of in-line groove portions are formed in a top surface thereof and a cell of a solar cell is formed, a print process of printing a conductive material onto a periphery of each of the plurality of in-line groove portions, and a cutting process of dividing the substrate along one of the plurality of in-line groove portions.

A method of manufacturing a solar cell according to the present invention may include a cell mounting process of mounting a cell, where a plurality of thin film layers are formed on a substrate with a substrate division part formed therein, in a processing space for manufacturing a solar cell, a print process of printing a conductive material onto the cell, a cutting process of dividing the cell into a plurality of unit cells, and a bonding process of bonding divided unit cells.

A solar cell according to the present invention may include a substrate having a conductive polarity and a first thin film layer formed on the substrate. The substrate may include a substrate division part which is formed at one surface of the substrate before the first thin film layer is formed and has a size which is progressively reduced in a downward direction. The first thin film layer may include a first division member inserted into the substrate division part.

A solar cell according to the present invention may include a plurality of unit cells each including a plurality of thin film layers formed on a substrate. Each of the plurality of unit cells may include a cell top surface disposed in an upward direction, a cell cross-sectional groove formed in the cell top surface, a first cross-sectional surface disposed to face the cell cross-sectional groove, and a second cross-sectional surface connected to each of the first cross-sectional surface and the cell top surface. An included angle between the first cross-sectional surface and the second cross-sectional surface may be equal to or less than 180 degrees.

A substrate for solar cells according to the present invention may include a substrate body having a conductive polarity, a first groove formed in the substrate body, a second groove communicating with the first groove to enlarge an etching surface facing the first groove, and a damage prevention part formed to be stepped with respect to the etching surface and formed with the second groove being disposed inward therefrom.

Advantageous Effect

According to the present invention, the following effects are obtained.

The present invention may be implemented to decrease the possibility of occurrence of a layer short phenomenon, thereby increasing the amount of generated power.

The present invention may be implemented to remove a particle and a crack from a cell, thereby enhancing the quality of a finished solar cell.

MODE FOR INVENTION

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship. In describing a position relationship, for example, when a position relation between two parts is described as 'on~', 'over~', 'under~', and 'next~', one or more other parts may be disposed between the two parts unless 'just' or 'direct' is used. In describing a time relationship, for example, when the temporal order is described as 'after~', 'subsequent~', 'next~', and 'before~', a case which is not continuous may be included unless 'just' or 'direct' is used.

Hereinafter, an embodiment of a method of manufacturing a solar cell according to the present invention will be described in detail with reference to the accompanying drawings.

The method of manufacturing a solar cell according to the present invention is for manufacturing a solar cell which converts light energy of sunlight into electrical energy. The method of manufacturing a solar cell according to the present invention may be used to manufacture a wafer type solar cell and a thin film type solar cell. The method of manufacturing a solar cell according to the present invention may be used to form a division part for dividing a substrate, which is for manufacturing a solar cell, into a plurality of pieces. Hereinafter, an embodiment where a wafer type solar cell is manufactured by the method of manufacturing a solar cell according to the present invention will be described, but it is obvious to those skilled in the art that a thin film type solar cell is manufactured by the method of manufacturing a solar cell according to the present invention.

Figure 1A:
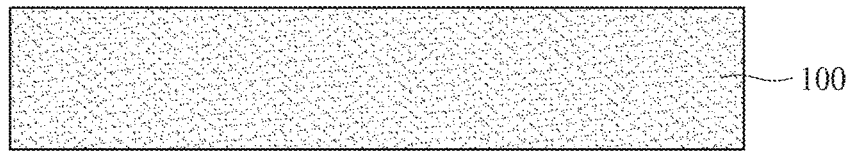
FIGS. 1A to 1C are schematic process side views illustrating a method of manufacturing a solar cell according to the related art.
Figure 1B:
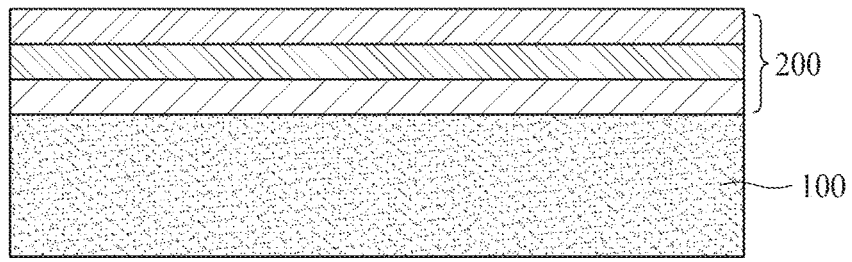
Figure 1C:
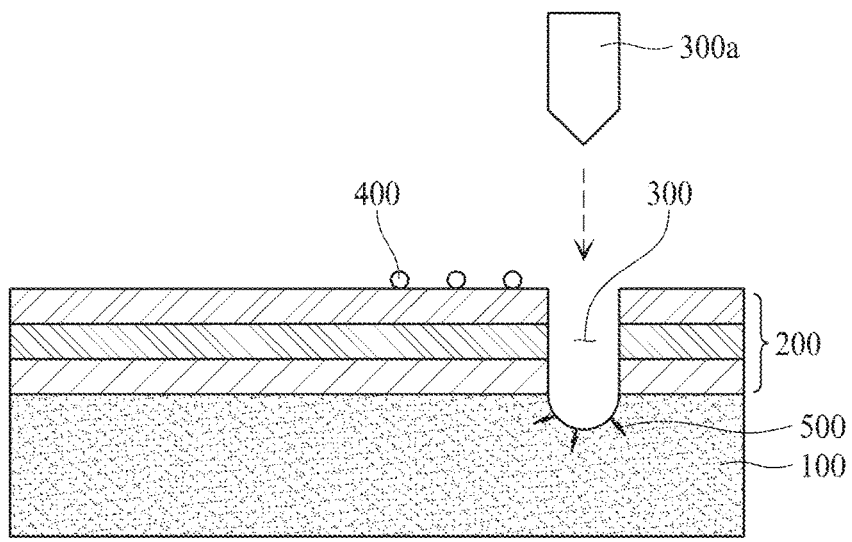
Figure 2:
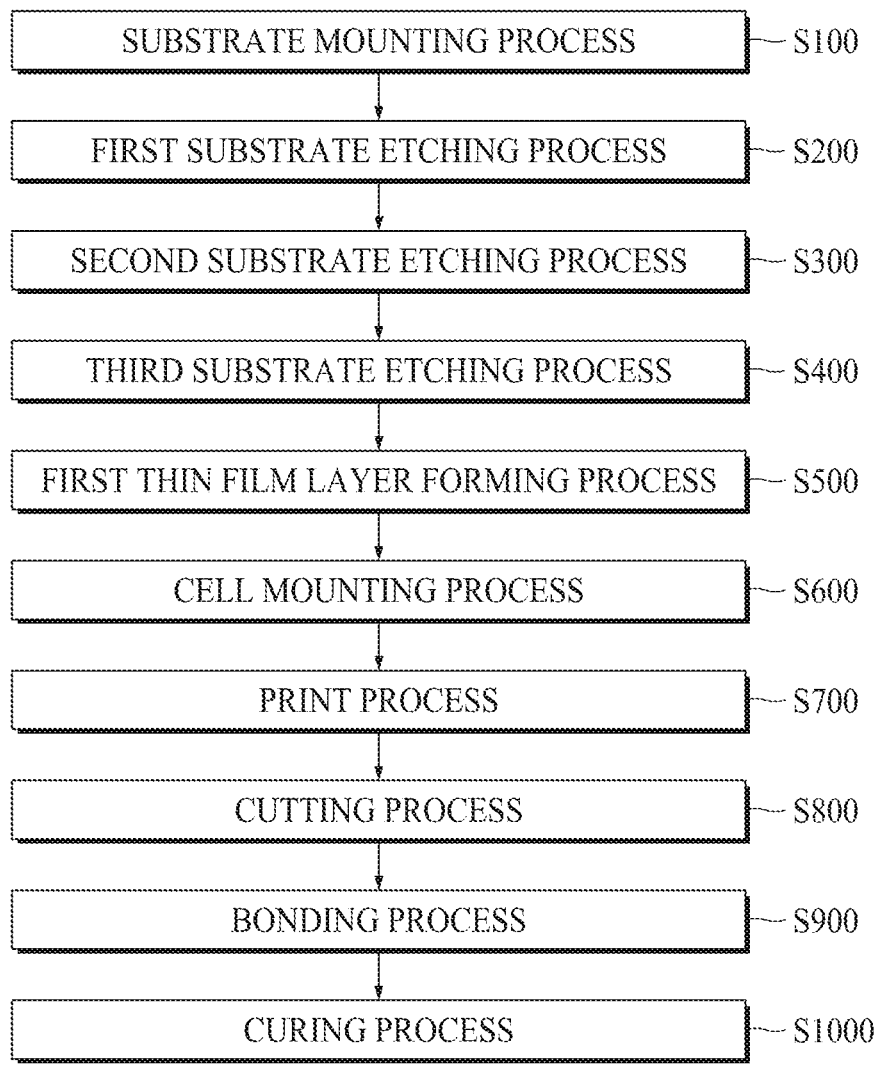
FIG. 2 is a schematic flowchart of a method of manufacturing a solar cell according to the present invention.
Figure 3A:
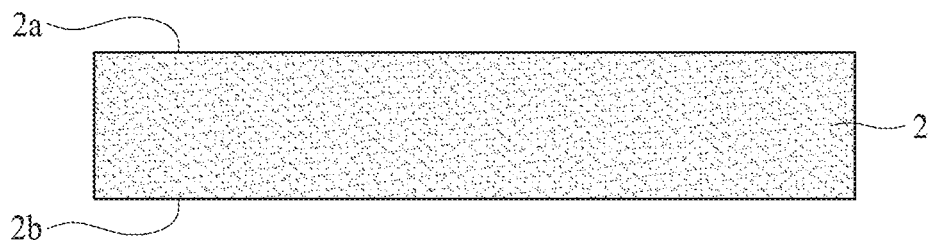
FIG. 3A is a schematic process front cross-sectional view illustrating a substrate mounting process in a method of manufacturing a solar cell according to the present invention.

Referring to FIGS. 2 and 3A, a method of manufacturing a solar cell according to the present invention may include a substrate mounting process (S100).

The substrate mounting process (S100) may be a process for mounting a substrate 2 in a processing space for manufacturing a solar cell. That is, the substrate mounting process (S100) may be a process of preparing the substrate 2, for manufacturing the solar cell. The substrate mounting process (S100) may be performed by a substrate loading apparatus (not shown) which loads the substrate 2 into the processing space. The processing space may internally accommodate a manufacturing apparatus (not shown) needed for manufacturing the solar cell and may be wholly implemented as a chamber. The substrate 2 may be for enabling a plurality of thin film layers to be stacked thereon and may have a certain conductive polarity. The substrate 2 may be formed of a silicon wafer. For example, the substrate 2 may be formed of an N-type silicon wafer or a P-type silicon wafer. Although not shown, one surface 2a of the substrate 2 may have a concave-convex structure. The substrate 2 may include a top surface of the substrate 2 which is disposed in an upward direction with being mounted in the processing space, a bottom surface of the substrate 2 which is disposed in a downward direction opposite to the upward direction, and a side surface of the substrate connected to each of the top surface and the bottom surface of the substrate 2. In this case, the one surface 2a of the substrate 2 may correspond to one surface of the top surface of the substrate 2, the bottom surface of the substrate 2, and the side surface of the substrate 2. For example, when the one surface 2a of the substrate 2 corresponds to the top surface of the substrate 2, the other surface 2b of the substrate 2 may correspond to the bottom surface of the substrate 2. In this case, each of thin film layers formed on the one surface 2a of the substrate 2 and the other surface 2b of the substrate 2 may be formed in a concave-convex structure.

Figure 3B:
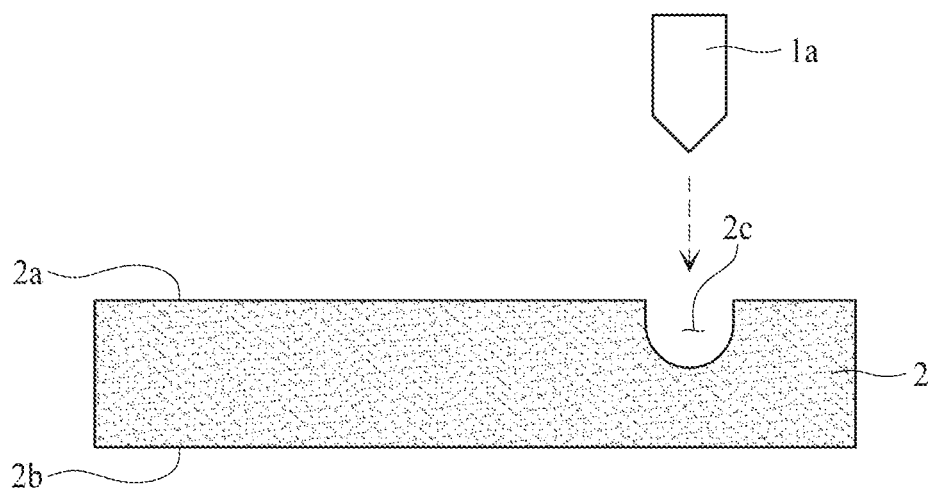
FIG. 3B is a schematic process front cross-sectional view illustrating a first substrate etching process in a method of manufacturing a solar cell according to the present invention.

Referring to FIGS. 2 and 3B, the method of manufacturing the solar cell according to the present invention may include a first substrate etching process (S200).

The first substrate etching process (S200) may be a process of forming a first groove 2c (illustrated in FIG. 3B) in the substrate 2. For example, the first substrate etching process (S200) may be implemented as a scribing process of irradiating a laser toward the substrate 2. When the first substrate etching process (S200) is implemented as the scribing process using the laser, the first substrate etching process (S200) may be performed by a scribing apparatus 1a. An arrow illustrated as a one-dot-dashed line in FIG. 3B schematically illustrates the laser irradiated by the scribing apparatus 1a. In the present specification, it is described that the first substrate etching process (S200) is performed on the one surface 2a of the substrate 2, but this is merely an example and the first substrate etching process (S200) may be performed on the other surface 2b of the substrate 2.

Hereinafter, it is described that the first substrate etching process (S200) is implemented as the scribing process, but this is merely an example and the first substrate etching process (S200) may be performed as a process of digesting the substrate 2 in one etching bath (not shown) for forming the first groove 2c, a dry etching process, or a process using a mask.

The first substrate etching process (S200) may be performed by irradiating a laser toward the substrate 2. The first substrate etching process (S200) may be performed by irradiating the laser onto the one surface 2a of the substrate 2. Therefore, the first groove 2c may be formed by removing a certain region of the substrate 2. The first groove 2c formed through the first substrate etching process (S200) may be implemented as a groove which is recessed from the one surface 2a of the substrate 2 by a certain depth. The first groove 2c may be formed in a first direction from the one surface 2a of the substrate 2. The first direction may be a direction from the one surface 2a of the substrate 2 to the other surface 2b of the substrate 2. The first groove 2c may be formed to extend from one side of the one surface 2a of the substrate 2 to the other side of the one surface 2a of the substrate 2. FIG. 3B schematically illustrates an embodiment where one first groove 2c is formed in the substrate 2. When a plurality of first grooves 2c are to be formed in the substrate 2, the first substrate etching process (S200) may be performed by a plurality of substrate scribing apparatuses 1a. Therefore, the method of manufacturing the solar cell according to the present invention may decrease a time taken in the first substrate etching process (S200). When a plurality of first grooves 2c are to be formed in the substrate 2, the first substrate etching process (S200) may be performed by moving one substrate scribing apparatus 1a.

As the first substrate etching process (S200) is performed, the first groove 2c may be formed to have a first depth from the one surface 2a of the substrate 2. The first depth may be a size of the first groove 2c with respect to a separation direction in which the one surface 2a of the substrate 2 is apart from the other surface 2b of the substrate 2. As the first substrate etching process (S200) is performed, the first groove 2c may be formed to have a first length. The first length may be a size of the first groove 2c with respect to the first direction. The first length and the first depth may have the same value.

The first substrate etching process (S200) may be performed before forming a first thin film layer 3 on the substrate 2. Therefore, comparing with the related art where a laser is irradiated after one or more thin film layers are formed on the substrate 2, the method of manufacturing the solar cell according to the present invention may implement a preventive force which prevents a layer short phenomenon caused by bonding of thin film layers. Accordingly, the method of manufacturing the solar cell according to the present invention may realize an effect of increasing an amount of power capable of being generated by the solar cell.

Figure 5A:
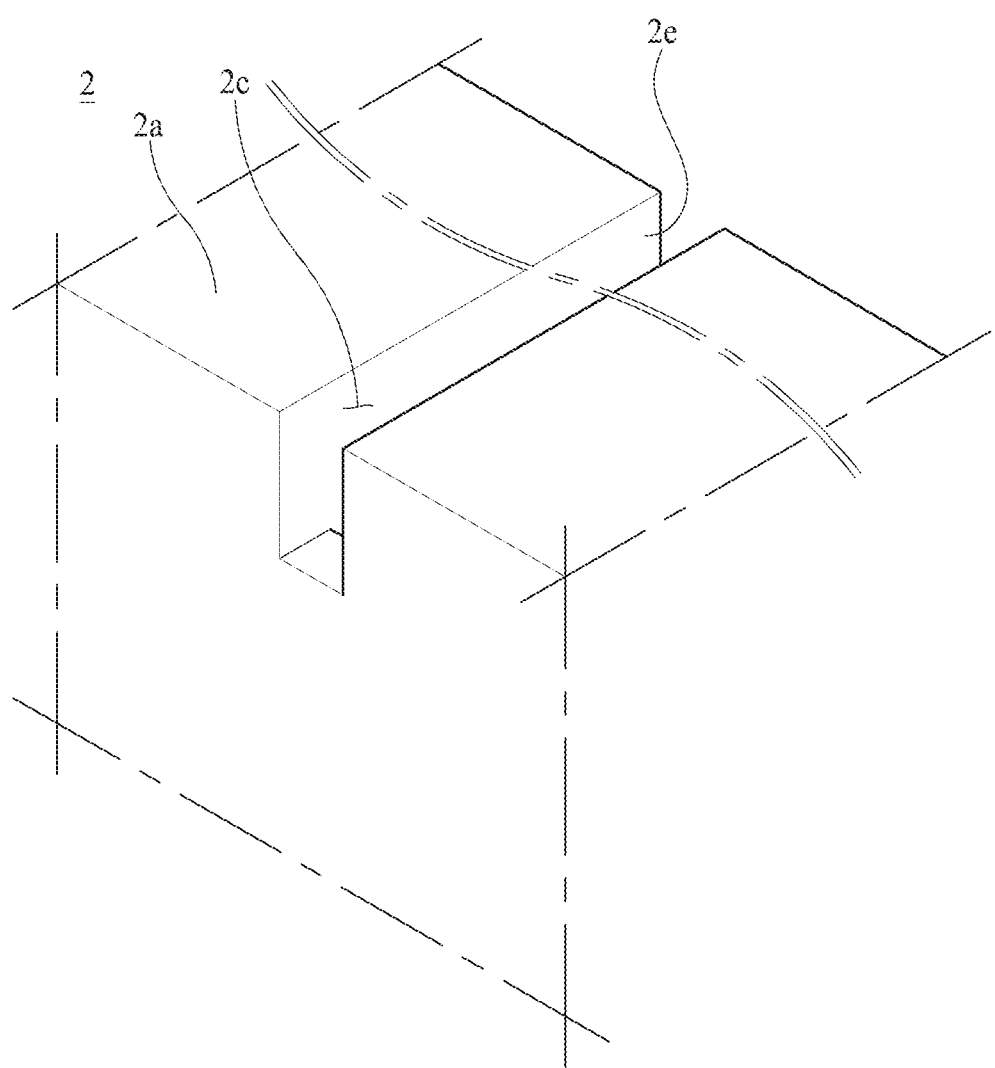
FIG. 5A is a schematic perspective view of a substrate for solar cells according to the present invention.
Figure 5B:
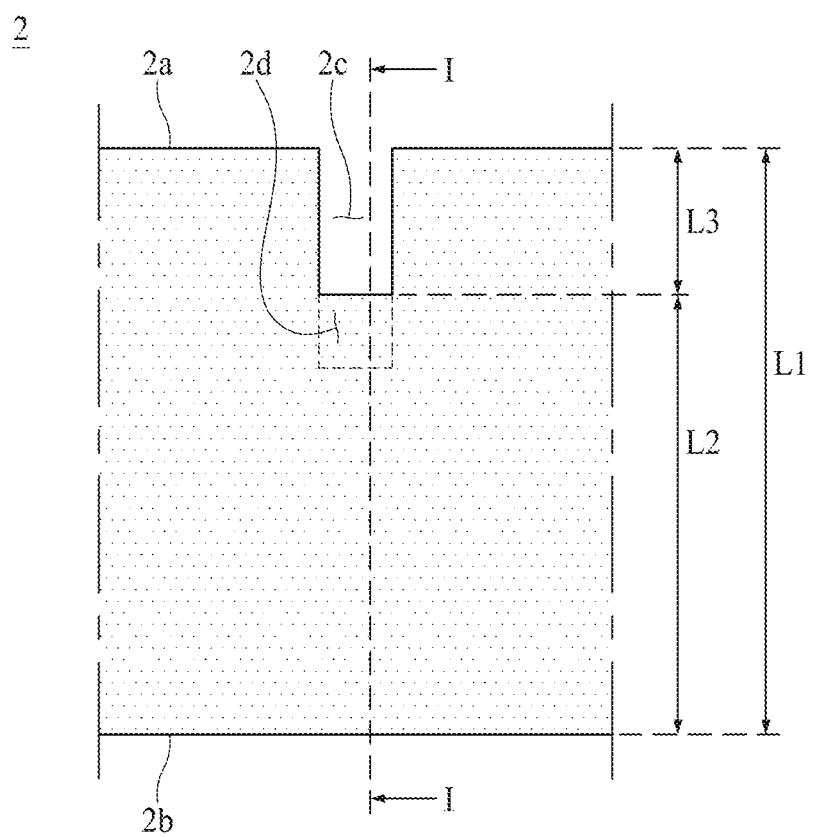
FIG. 5B is a schematic front view of a substrate for solar cells according to the present invention.
Figure 5C:
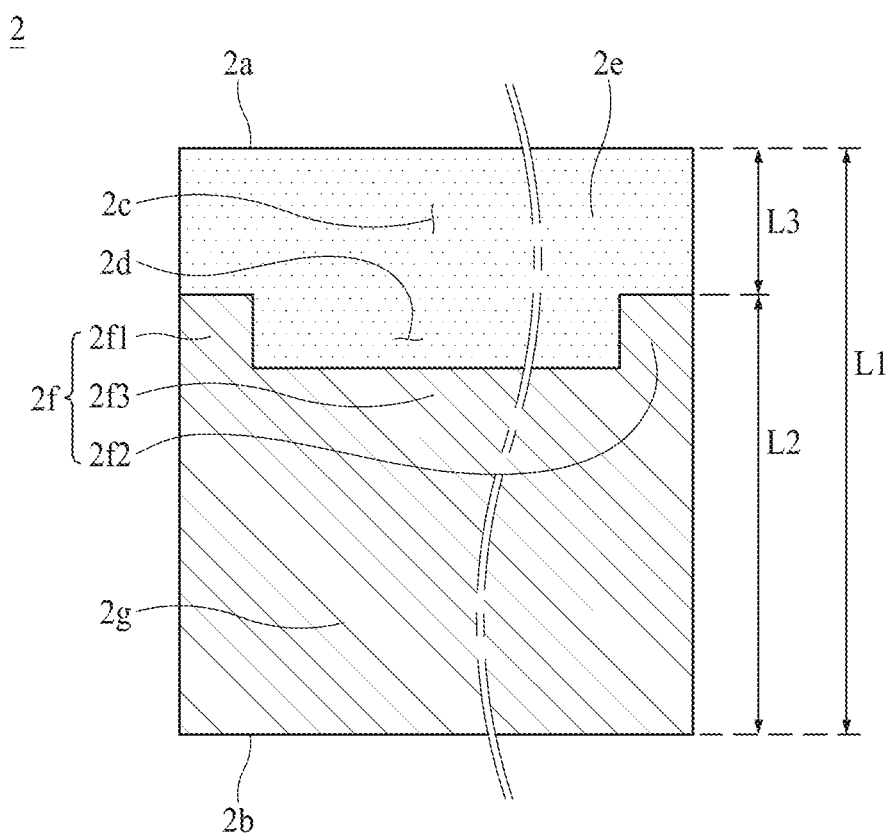
FIG. 5C is a side cross-sectional view taken along line I-I of FIG. 5B.
Figure 5D:
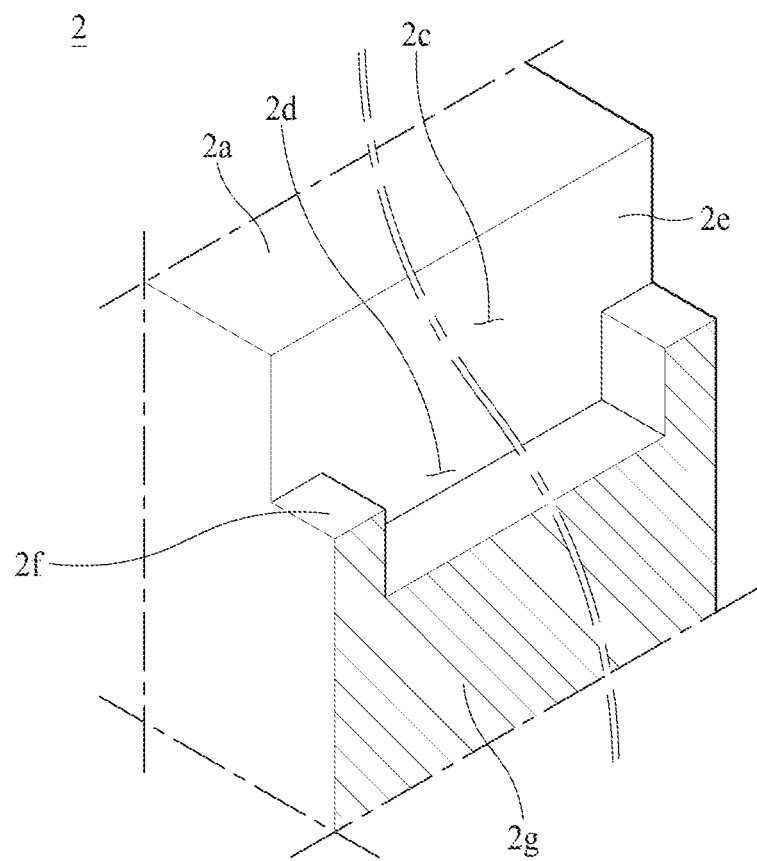
FIG. 5D is a schematic perspective view illustrating a cross-sectional surface in a substrate for solar cells according to the present invention.

Referring to FIGS. 2 and 5A to 5D, the method of manufacturing the solar cell according to the present invention may include a second substrate etching process (S300). Dots illustrated in FIGS. 5B and 5C do not illustrate a cross-sectional surface of a configuration but are illustrated for dividing a configuration. Also, two one-dot-dashed lines illustrated in FIGS. 5A, 5C, and 5D are for omitting a length of the substrate 2 with respect to a scribing direction in which the first groove 2c is formed.

The second substrate etching process (S300) is a process of forming a second groove 2d for enlarging an etching surface 2e facing the first groove 2c. The second substrate etching process (S300) may be a process of forming the second groove 2d in the first groove 2c. That is, as the second substrate etching process (S300) is performed, the second groove 2d may communicate with the first groove 2c. The etching surface 2e may be formed by performing a process of forming the first groove 2c. The second substrate etching process (S300) may be performed after the first groove 2c is formed. The second substrate etching process (S300) may be performed by irradiating a laser toward the substrate 2. The second substrate etching process (S300) may be performed by etching a portion of the substrate 2 facing the first groove 2c. A process of forming the first groove 2c and the second substrate etching process (S300) may all be performed by the scribing apparatus 1a using a laser.

In the method of manufacturing the solar cell according to the present invention, as the second substrate etching process (S300) is performed, the etching surface 2e may be enlarged by the second groove 2d. The etching surface 2e may have a cross-sectional surface which is better in quality than a substrate cross-sectional surface 2g (illustrated in FIGS. 5C and 5D) formed by dividing the substrate 2 into two or more pieces, and thus, the method of manufacturing the solar cell according to the present invention may enhance the total quality of a finished solar cell.

As the second substrate etching process (S300) is performed, the second groove 2d may be formed to have a second depth from the one surface 2a of the substrate 2. The second depth may be a sum of sizes of the first groove 2c and the second groove 2d with respect to the separation direction. The second depth may be formed to be greater than the first depth. As the second substrate etching process (S300) is performed, the second groove 2d may be formed to have a second length. The second length may be a size of the second groove 2d with respect to the first direction. The second length may be formed to be shorter than the first length.

As the second substrate etching process (S300) is performed, a damage prevention part 2f may be formed to have a step height with respect to the etching surface 2e. As the second groove 2d is formed, the damage prevention part 2f may be formed. The damage prevention part 2f may provide a supporting force to the substrate 2 so as to prevent damage such as the substrate 2 being divided into two or more pieces. Therefore, the method of manufacturing the solar cell according to the present invention may decrease the possibility of damage of the substrate 2 even when a physical impact such as collision between the substrate 2 and a process apparatus installed in the processing space occurs in a process of transporting the substrate 2. Accordingly, the method of manufacturing the solar cell according to the present invention may enhance process stability in manufacturing a solar cell.

Referring to FIGS. 2 and 3C to 3G, the method of manufacturing the solar cell according to the present invention may include a third substrate etching process (S400).

The third substrate etching process (S400) is a process of etching the one surface 2a of the substrate 2. The third substrate etching process (S400) may be performed by etching, by a certain thickness, the one surface 2a of the substrate 2 including the second groove 2d. The third substrate etching process (S400) may be performed by an etching apparatus (not shown) which etches the one surface 2a of the substrate 2. The third substrate etching process (S400) may be performed after the first substrate etching process (S200). In the present specification, it is described that the third substrate etching process (S400) is performed on the one surface 2a of the substrate 2, but this is merely an example and the third substrate etching process (S400) may be performed on the other surface 2b of the substrate 2 or may be performed simultaneously on each of the one surface 2a of the substrate 2 and the other surface 2b of the substrate 2.

The etching apparatus which performs the third substrate etching process (S400) may etch the one surface 2a of the substrate 2 by using a wet etching process. The wet etching process may be performed as a process of spraying a certain etchant onto the substrate 2 by using a nozzle (not shown). In a case which sprays the certain etchant onto the substrate 2 by using the nozzle (not shown), the third substrate etching process (S400) may be continuously performed by transporting the substrate 2 to a transport roller (not shown). The etchant may include at least one etching material selected from among the group consisting of NaOH, KOH, HCl, $HNO_3$, $H_2SO_4$, $H_3PO_3$, $H_2O_2$, and $C_2H_2O_4$. The wet etching process may be performed as a process which stores the etchant in the etching bath and digests the substrate 2 into the etchant.

In a case where the third substrate etching process (S400) is performed as a process of digesting the substrate 2 into the etchant, the third substrate etching process (S400) may be implemented as a process of moving the etchant along a scribing direction in which the first groove 2c is formed. Therefore, the method of manufacturing the solar cell according to the present invention may equally implement a ratio of a thickness L3 of the first groove 2c(illustrated in FIGS. 5B and 5C) to a thickness of the substrate 2 (illustrated in FIGS. 5B and 5C) in a process of performing the third substrate etching process (S400). A thickness L3 of the first groove 2c may have the same value as that of each of the first depth and the first length.

Figure 3C:
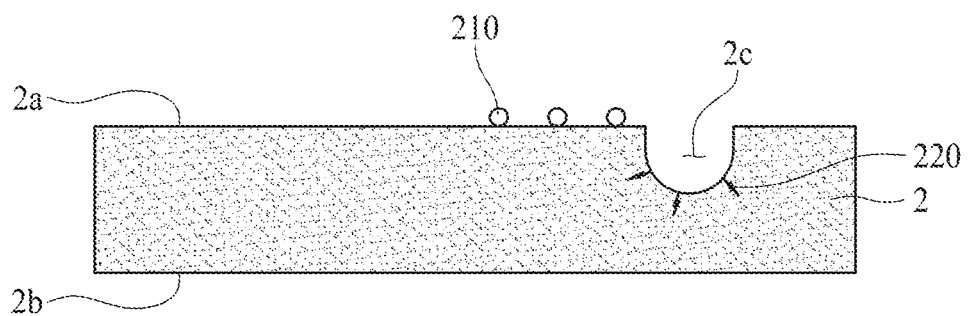
FIG. 3C is a schematic process front cross-sectional view illustrating an embodiment where a particle and a crack are formed in a cell by performing the first substrate etching process, in a method of manufacturing a solar cell according to the present invention.
Figure 3D:
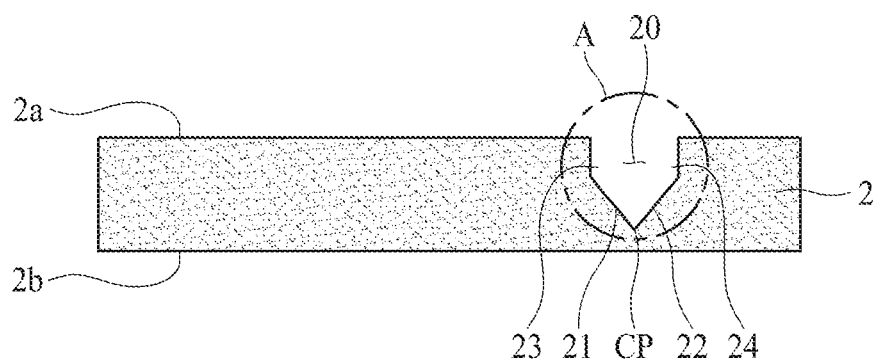
FIG. 3D is a schematic process front cross-sectional view illustrating a substrate on which a third substrate etching process has been performed, in a method of manufacturing a solar cell according to the present invention.

Referring to FIGS. 3C and 3D, the third substrate etching process (S400) may include a process of removing a particle 210 (illustrated in FIG. 3C) formed on the one surface 2a of the substrate 2. The process of removing the particle may be performed by etching the one surface 2a of the substrate 2. Therefore, the method of manufacturing the solar cell according to the present invention may remove the particle 210 from the cell, thereby enhancing the quality of a solar cell.

Referring to FIGS. 3C and 3D, the third substrate etching process (S400) may include a process of forming a substrate division part. The process of forming the substrate division part may be performed by etching the one surface 2a of the substrate 2 facing the first groove 2c. Therefore, the method of manufacturing the solar cell according to the present invention may be implemented to remove a crack 220 (illustrated in FIG. 3C) formed on the one surface 2a of the substrate 2 facing the first groove 2c. Accordingly, the method of manufacturing the solar cell according to the present invention may enhance the quality of a finished solar cell.

As the process of forming the substrate division part is performed, a substrate division part 20 (illustrated in FIG. 3D) may be formed at a position at which the first groove 2c is formed. The substrate division part 20 is formed at a position at which each the first groove 2c and the second groove 2d is formed, and thus, may include the first groove 2c and the second groove 2d. The substrate division part 20 may be a division part for dividing the substrate, which is for manufacturing a solar cell, into a plurality of pieces. The substrate division part 20 may be implemented as a groove having a size which is greater than that of each of the first groove 2c and the second groove 2d. The substrate division part 20 may be formed so that a size thereof is progressively reduced in the downward direction. For example, the substrate division part 20 may be formed to have a sharp-end shape which is progressively sharpened in the downward direction. The substrate 2 may be divided into a plurality of pieces by the substrate division part 20 formed by the third substrate etching process (S400). The substrate division part 20 may be implemented as a groove which is wholly recessed from the one surface 2a of the substrate 2 by a certain depth.

A special order is not designated in performing a process of forming the substrate division part and a process of removing the particle. That is, the process of forming the substrate division part may be performed prior to the process of removing the particle, or the process of forming the substrate division part and the process of removing the particle may be performed simultaneously.

Referring to FIG. 3D, the process of forming the substrate division part may include a process of forming a first division surface.

The process of forming the first division surface is a process of forming a first division surface 21 facing the substrate division part 20. The process of forming the first division surface may be performed as the etching apparatus etches the one surface 2a of the substrate 2 facing the first groove 2c. As the process of forming the first division surface is performed, the first division surface 21 may be formed to be inclined with respect to the one surface 2a of the substrate 2.

Referring to FIG. 3D, the process of forming the substrate division part may include a process of forming a second division surface.

The process of forming the second division surface is a process of forming a second division surface 22 connected to the first division surface 21. The second division surface 22 may be disposed to face the substrate division part 20. The process of forming the second division surface may be performed as the etching apparatus etches the one surface 2a of the substrate 2 facing the first groove 2c. As the process of forming the second division surface is performed, the second division surface 22 may be formed to be inclined with respect to the one surface 2a of the substrate 2. As the process of forming the second division surface is performed, the second division surface 22 and the first division surface 21 may be connected to each other to form a sharp end which is progressively sharpened in the downward direction. That is, a corner may be formed at a connection point CP at which the second division surface 22 is connected to the first division surface 21. The connection point CP may be disposed to be apart from the one surface 2a of the substrate 2 by a first separation distance of about 46.8 μm with respect to a first axial direction. The first axial direction may be a direction which is parallel to a direction in which a laser is irradiated and is parallel to each of the upward direction and the downward direction.

Referring to FIG. 3D, the process of forming the substrate division part may include a process of forming a first connection surface.

The process of forming the first connection surface is a process of forming a first connection surface 23 connected to each of the first division surface 21 and the one surface 2a of the substrate 2. The first connection surface 23 may be disposed to face the substrate division part 20. The process of forming the first connection surface 23 may be performed as the etching apparatus etches the one surface 2a of the substrate 2 facing the first groove 2c. As the process of forming the first connection surface is performed, the first connection surface 23 may be disposed to be inclined with respect to the one surface 2a of the substrate 2. For example, an included angle between the first connection surface 23 and the one surface 2a of the substrate 2 may be about 90 degrees.

Figure 4:
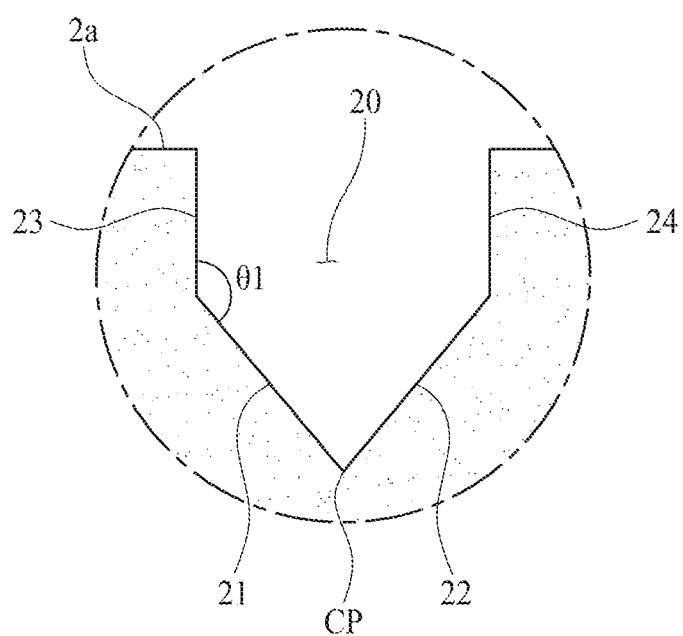
FIG. 4 is an enlarged view of a portion A of FIG. 3D.

As the process of forming the first connection surface is performed, an included angle θ1 (illustrated in FIG. 4) between the first connection surface 23 and the first division surface 21 may be about 180 degrees or less. As the process of forming the first connection surface is performed, a corner may be formed at a portion at which the first connection surface 23 is connected to the first division surface 21. The portion at which the first connection surface 23 is connected to the first division surface 21 may be disposed to be apart from the connection point CP by a second separation distance of about 29.8 μm with respect to the first axial direction. That is, the second separation distance may be formed to be shorter than the first separation distance.

Referring to FIG. 3D, the process of forming the substrate division part may include a process of forming a second connection surface.

The process of forming the second connection surface is a process of forming a second connection surface 24 connected to each of the second division surface 22 and the one surface 2a of the substrate 2. The second connection surface 24 may be disposed to face the substrate division part 20. The process of forming the second connection surface 24 may be performed as the etching apparatus etches the one surface 2a of the substrate 2 facing the first groove 2c. As the process of forming the second connection surface is performed, the second connection surface 24 may be disposed to be inclined with respect to the one surface 2a of the substrate 2. For example, an included angle between the second connection surface 24 and the one surface 2a of the substrate 2 may be about 90 degrees. As the process of forming the second connection surface is performed, the second connection surface 24 may be disposed in parallel with the first connection surface 23. The second connection surface 24 may be disposed to be apart from the first connection surface 23 by a third separation distance of about 50.8 μm with respect to a second axial direction vertical to the first axial direction.

As the process of forming the second connection surface is performed, an included angle between the second connection surface 24 and the second division surface 22 may be 180 degrees or less. As the process of forming the second connection surface is performed, a corner may be formed at a portion at which the second connection surface 24 is connected to the second division surface 22.

A special order is not designated in performing the process of forming the second connection surface, the process of forming the first connection surface, the process of forming the second division surface, and the process of forming the first division surface. For example, the process of forming the first division surface, the process of forming the second division surface, the process of forming the first connection surface, and the process of forming the second connection surface may be sequentially performed. The process of forming the first division surface, the process of forming the second division surface, the process of forming the first connection surface, and the process of forming the second connection surface may be simultaneously performed.

Hereinafter, an embodiment of the third substrate etching process (S400) using the nozzle in the method of manufacturing the solar cell according to the present invention will be described with reference to the accompanying drawings.

First, as illustrated in FIG. 3A, the substrate 2 is prepared.

Subsequently, as illustrated in FIG. 3B, the first substrate etching process (S200) of irradiating a laser onto the one surface 2a of the substrate 2 is performed. Therefore, the first groove 2c may be formed in the substrate 2. In this case, as illustrated in FIG. 3C, the particle 210 may be formed on the one surface 2a of the substrate 2, and moreover, the crack 220 may be formed in the one surface 2a of the substrate 2 facing the first groove 2c. Subsequently, the third substrate etching process (S400) is performed on the one surface 2a of the substrate 2. As the third substrate etching process (S400) is performed, the substrate 2 may be etched from the one surface 2a of the substrate 2 by a certain depth, and thus, the particle 210 formed on the one surface 2a of the substrate 2 may be removed therefrom. Accordingly, the method of manufacturing the solar cell according to the present invention may decrease a possibility that layer short occurs between thin film layers formed on the substrate 2.

Subsequently, the third substrate etching process (S400) is performed up to a position at which the first groove 2c is formed. As the third substrate etching process (S400) is performed, the substrate division part 20 may be formed to be greater than the first groove 2c, and thus, the one surface 2a of the substrate 2 facing the first groove 2c may be etched. Accordingly, the method of manufacturing the solar cell according to the present invention may be implemented to remove the crack 220.

Subsequently, as illustrated in FIG. 3D, the third substrate etching process (S400) is performed on a whole surface of the one surface 2a of the substrate 2. Accordingly, in the method of manufacturing the solar cell according to the present invention, the third substrate etching process (S400) is completed.

Figure 3E:
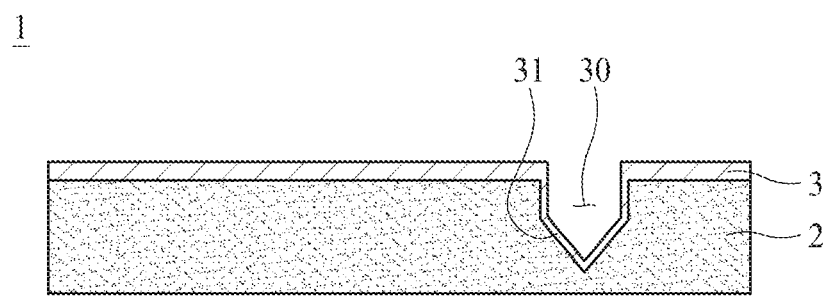
FIG. 3E is a schematic process front cross-sectional view illustrating an embodiment where a first thin film layer forming process has been performed on a substrate, in a method of manufacturing a solar cell according to the present invention.

Referring to FIGS. 2 and 3E, the method of manufacturing the solar cell according to the present invention may include a first thin film layer forming process (S500).

The first thin film layer forming process (S500) is a process of forming a first thin film layer 3 on the substrate 2. As the first thin film layer forming process (S500) is performed, the first thin film layer 3 may be stacked on the one surface 2a of the substrate 2. The first thin film layer forming process (S500) may be performed on the substrate 2 after the first substrate etching process (S200) and the third substrate etching process (S400). The first thin film layer formed by the first thin film layer forming process (S500) may be a semiconductor layer which is formed on the substrate 2 as a thin film type. The first thin film layer 3 may form a PN junction along with the substrate 2. Therefore, when the substrate 2 includes an N-type silicon wafer, the first thin film layer 3 may be formed of a P-type semiconductor layer. The first thin film layer 3 may be formed by using a chemical vapor deposition (CVD) process and the like. The first thin film layer 3 may be formed in a PIN structure where a P-type semiconductor material, an I-type semiconductor material, and an N-type semiconductor material are sequentially stacked. When the first thin film layer 3 is formed in the PIN structure in this manner, the I-type semiconductor material is depleted by the P-type semiconductor material and the N-type semiconductor material, and thus, an electric field is generated therein, whereby a hole and an electron generated by sunlight are drifted by the electric field and are respectively collected in the P-type semiconductor material and the N-type semiconductor material. In a case where the first thin film layer 3 is formed in the PIN structure, it is preferable that the P-type semiconductor material is formed on the first thin film layer 3, and then, the I-type semiconductor material and the N-type semiconductor material are formed. The reason is for forming the P-type semiconductor material at a position close to a light receiving surface so as to maximize collection efficiency based on incident light because a drift mobility of a hole is lower than a drift mobility of an electron generally. The method of manufacturing the solar cell according to the present invention may form the first thin film layer 3 to have a stacked type structure. For example, the method of manufacturing the solar cell according to the present invention may form the first thin film layer 3 to have a staked type structure of a tandem [tandem(PIN/PIN)] type or a triple [triple(PIN/PIN/PIN)] type.

The first thin film layer forming process (S500) may be performed on the one surface 2a of the substrate 2. The first thin film layer forming process (S500) may be performed on the other surface 2b of the substrate 2. For example, the first thin film layer forming process (S500) may be a process of forming an N-type semiconductor layer 3a (illustrated in FIGS. 6A and 6B) on the one surface 2a of the substrate 2 and forming a P-type semiconductor layer 3b (illustrated in FIGS. 6A and 6B) on the other surface 2b of the substrate 2. In a case where the first thin film layer 3 is stacked on each of the one surface 2a and the other surface 2b of the substrate 2, the first thin film layer 3 may be formed by using a plasma enhanced chemical vapor deposition (PECVD) process and a sputtering process. In this case, a special order is not designated in performing a process of forming the first thin film layer 3 on the one surface 2a of the substrate 2 and a process of forming the first thin film layer 3 on the other surface 2b of the substrate 2.

Referring to FIG. 3E, the first thin film layer forming process (S500) may include a process of forming a first thin film division part and a process of forming a first division member.

The process of forming the first thin film division part is a process of forming a first thin film division part 30 on the first thin film layer 3. The process of forming the first thin film division part 30 may be performed by etching one surface of the first thin film layer 3. As the process of forming the first thin film division part is performed, the first thin film division part 30 may be formed on the one surface of the first thin film layer 3. The first thin film layer 3 may be divided into a plurality of pieces by the first thin film division part 30. The first thin film division part 30 may be formed at a corresponding position of the substrate division part 20. The first thin film division part 30 may be a division part for dividing a substrate, which is for manufacturing a solar cell, into a plurality of pieces. The first thin film division part 30 may be implemented as a groove which is wholly recessed from the one surface of the first thin film layer 3 by a certain depth. The first thin film division part 30 may have a size which is progressively reduced in the downward direction.

The process of forming the first division member is a process of forming a first division member 31 inserted into the substrate division part 20. The process of forming the first division member may be performed by stacking the first thin film layer 3 on the substrate 2. As the process of forming the first division member is performed, the first division member 31 may be formed on the other surface of the first thin film layer 3. The first division member 31 may be formed in a shape corresponding to the substrate division part 20. For example, in a case where the substrate division part is formed in a shape where a size thereof is progressively narrowed in a downward direction, the first division member 31 may be formed in a shape where a size thereof is progressively narrowed in the downward direction.

A special order is not designated in performing the process of forming the first division member and the process of forming the first thin film division part. For example, the process of forming the first division member may be performed prior to the process of forming the first thin film division part, and the process of forming the first division member and the process of forming the first thin film division part may be performed simultaneously.

Figure 3F:
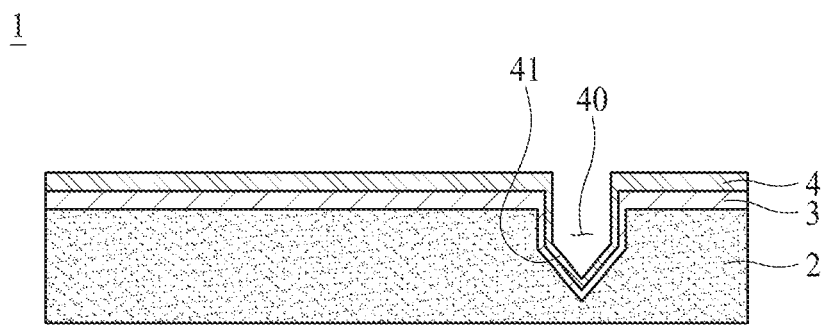
FIG. 3F is a schematic process front cross-sectional view illustrating an embodiment where a second thin film layer forming process has been performed on a first thin film layer, in a method of manufacturing a solar cell according to the present invention.

Referring to FIG. 3F, the method of manufacturing the solar cell according to the present invention may include a second thin film layer forming process.

The second thin film layer forming process may be a process of forming a second thin film layer 4 on the first thin film layer 3. As the second thin film layer forming process is performed, the second thin film layer 4 may be stacked on the one surface of the first thin film layer 3. The second thin film layer forming process may be performed after the first thin film layer forming process (S500). The second thin film layer 4 formed by the second thin film layer forming process may be a transparent conductive layer. For example, the second thin film layer 4 may be a transparent conductive oxide (TCO) layer. In a case where the first thin film layer forming process (S500) is a process of forming the N-type semiconductor layer 3a (illustrated in FIGS. 6A and 6B) on the one surface 2a of the substrate 2 and forming the P-type semiconductor layer 3b (illustrated in FIGS. 6A and 6B) on the other surface 2b of the substrate 2, the second thin film layer forming process may be a process of forming a first TCO layer 4a (illustrated in FIGS. 6A and 6B) on the N-type semiconductor layer 3a and forming a second TCO layer 4b (illustrated in FIGS. 6A and 6B) on the P-type semiconductor layer 3b. The second thin film layer 4 may protect the first thin film layer 3, collect carriers (for example, holes (+)) generated in the substrate, and move the collected carriers in an upward direction. The upward direction may be a direction opposite to the downward direction. The second thin film layer may include a transparent conductive material such as indium tin oxide (ITO), ZnOH, ZnO:B, ZnO:Al, $SnO_2$, or $SnO_2$:F. The second thin film layer may be formed of a transparent conductive material such as ZnO, ZnO:B, ZnO:Al, or Ag by using a sputtering process or a metalorganic chemical vapor deposition (MOCVD) process. The second thin film layer 4 has a function of scattering sunlight to allow the sunlight to travel at various angles, thereby increasing a ratio of light re-incident on the first thin film layer. The method of manufacturing the solar cell according to the present invention may not form the second thin film layer and may form only the first thin film layer. That is, the method of manufacturing the solar cell according to the present invention may selectively form the second thin film layer 4.

Referring to FIG. 3F, the second thin film layer forming process may include a process of forming a second thin film division part and a process of forming a second division member.

The process of forming the second thin film division part is a process of forming a second thin film division part 40 on the second thin film layer 4. The process of forming the second thin film division part 40 may be performed by etching one surface of the second thin film layer 4. As the process of forming the second thin film division part is performed, the second thin film division part 40 may be formed on the one surface of the second thin film layer 4. The second thin film layer 4 may be divided into a plurality of pieces by the second thin film division part 40. The second thin film division part 40 may be formed at a corresponding position of the substrate division part 20. The second thin film division part 40 may be a division part for dividing a substrate, which is for manufacturing a solar cell, into a plurality of pieces. The second thin film division part 40 may be implemented as a groove which is wholly recessed from the one surface of the second thin film layer 4 by a certain depth. The second thin film division part 40 may have a size which is progressively reduced in the downward direction.

The process of forming the second division member is a process of forming a second division member 41 inserted into the substrate division part 20. The process of forming the second division member may be performed by stacking the second thin film layer 4 on the substrate 2. As the process of forming the second division member is performed, the second division member 41 may be formed on the other surface of the second thin film layer 4. The second division member 41 may be formed in a shape corresponding to the first thin film division part 30. For example, in a case where the first thin film division part 30 is formed in a shape where a size thereof is progressively narrowed in a downward direction, the second division member 41 may be formed in a shape where a size thereof is progressively narrowed in the downward direction.

A special order is not designated in performing the process of forming the second division member and the process of forming the second thin film division part. For example, the process of forming the second division member may be performed prior to the process of forming the second thin film division part, and the process of forming the second division member and the process of forming the second thin film division part may be performed simultaneously.

Referring to FIGS. 3D to 3G, the method of manufacturing the solar cell according to the present invention may include a cell manufacturing process.

The cell manufacturing process may be a process of forming a plurality of thin film layers on the substrate 2. As the cell manufacturing process is performed, a cell 20a where a plurality of thin film layers are stacked on the substrate 2 may be formed. The cell manufacturing process may be performed after the first thin film layer forming process (S500). In a case where only two thin film layers are stacked on the substrate 2, the cell manufacturing process may be the same process as the second thin film layer forming process. In a case where N (where N is an integer of 2 or more) number of thin film layers are stacked on the substrate 2, the method of manufacturing the solar cell according to the present invention may include a process of forming N number of thin film division parts and a process of forming N number of division members. Each of the thin film division parts may be implemented to be approximately equal to the first thin film division part 30. The division members may be implemented to be approximately equal to the first division member 31.

Figure 3G:
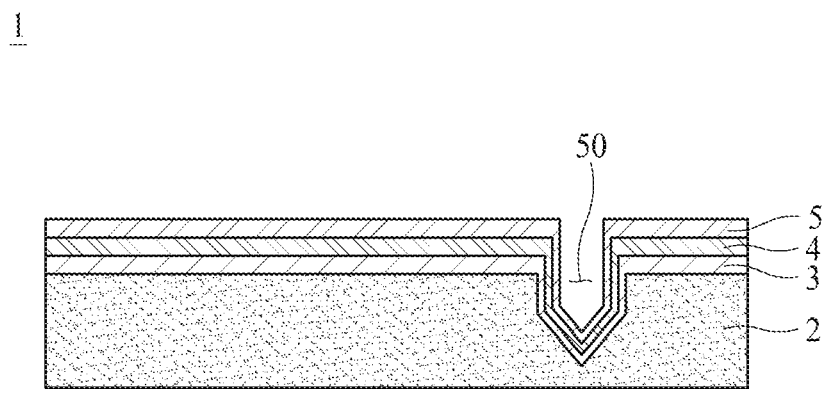
FIG. 3G is a schematic process front cross-sectional view illustrating an embodiment where a third thin film layer forming process has been performed on a second thin film layer, in a method of manufacturing a solar cell according to the present invention.

In FIG. 3G, three thin film layers 3 to 5 are illustrated as being stacked on the substrate 2, but this is merely an example and four or more thin film layers may be stacked on the substrate 2. As illustrated in FIG. 3G, in a case where three thin film layers are formed on the substrate 2, the first thin film layer 3 may be implemented as an intrinsic semiconductor layer, the second thin film layer 4 may be implemented as a semiconductor layer, and the third thin film layer 5 may be implemented as a transparent conductive layer. In this case, the third thin film layer 5 may be a perovskite layer 5a (illustrated in FIGS. 6A and 6B). The first thin film layer 3 may be formed by a process of forming an intrinsic (I)-type amorphous silicon layer on the one surface 2a of the substrate 2 by using a plasma enhanced chemical vapor deposition (PECVD) process.

Moreover, in FIG. 3G, the three thin film layers 3 to 5 are illustrated as being stacked on the one surface 2a of the substrate 2, but this is merely an example and the three thin film layers 3 to 5 may be form on only the other surface 2b of the substrate 2 or may be formed on each of the one surface 2a and the other surface 2b of the substrate 2. In this case, a plurality of thin film layers formed on each of the one surface 2a and the other surface 2b of the substrate 2 may be formed by using a plasma enhanced chemical vapor deposition (PECVD) process and a sputtering process. A special order is not designated in performing a process of forming a plurality of thin film layers on the one surface 2a of the substrate 2 and a process of forming a plurality of thin film layers on the other surface 2b of the substrate 2.

The method of manufacturing the solar cell according to the present invention may be implemented so that a thin film etching process of etching one surface of a thin film layer is successively performed whenever a plurality of thin film layers are formed on the substrate 2. For example, after the first thin film layer 3 is formed on the substrate 2, a process of irradiating a laser onto the first thin film layer 3 may be performed, and successively, a process of etching the one surface of the first thin film layer 3 may be performed. Therefore, the method of manufacturing the solar cell according to the present invention may be implemented so that a particle and a crack formed in the first thin film layer 3 are removed therefrom. Also, after the second thin film layer 4 is formed on the first thin film layer 4, a process of irradiating the laser onto the second thin film layer 4 may be performed, and successively, a process of etching one surface of the second thin film layer 4 may be performed. Therefore, the method of manufacturing the solar cell according to the present invention may be implemented so that a particle and a crack formed in the second thin film layer 4 are removed therefrom. As described above, the method of manufacturing the solar cell according to the present invention may be implemented so that a thin film etching process of etching one surface of a thin film layer is performed whenever a plurality of thin film layers are formed on the substrate 2, thereby enhancing the degree of completion of an etching process to enhance the quality of a finished solar cell.

Referring to FIG. 2, the method of manufacturing the solar cell according to the present invention may include a cell mounting process (S600).

The cell mounting process (S600) may be a process of mounting a cell 20a, where a plurality of thin film layers are formed on the substrate 2 with the substrate division part 20 formed therein, in the processing space. The cell mounting process (S600) may be performed by a loading apparatus (not shown) which loads the cell 20a into the processing space. In a case where the plurality of thin film layers are formed on the substrate 2, the cell mounting process (S600) may be performed after the cell manufacturing process.

Figure 7A:
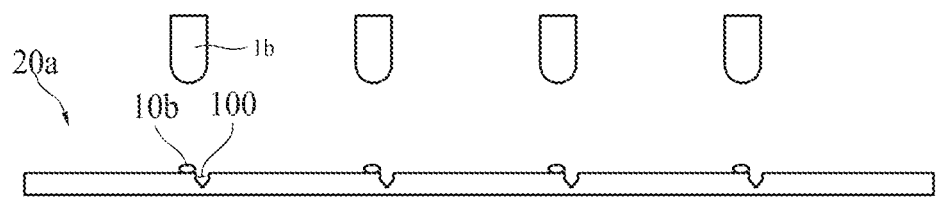
FIG. 7A is a schematic process side view illustrating a print process in a method of manufacturing a solar cell according to the present invention.

Referring to FIGS. 2 and 7A, the method of manufacturing the solar cell according to the present invention may include a print process (S700).

The print process (S700) may be a process of printing a conductive material 10b onto the cell 20a. The conductive material 10b may be a material, having conductivity, such as a transparent conductive film (TCF). The print process (S700) may be performed after the cell mounting process (S600). The print process (S700) may be performed on one surface of the cell 20a. The print process (S700) may also be performed on the other surface of the cell 20a. The print process (S700) may be performed by a conductive material printer 1b which is installed in the processing space. The print process (S700), as illustrated in FIG. 7A, may be performed by a plurality of conductive material printers 1b. Therefore, the method of manufacturing the solar cell according to the present invention may print a plurality of conductive materials 10b onto a whole surface of the cell 20a, thereby decreasing a time taken in the print process (S700).

As the print process (S700) is performed, the conductive material 10b may be printed onto the cell 20a. In a case where only the first thin film layer 3 is stacked on the substrate 2, as the print process (S700) is performed, the conductive material 10b may be printed onto the first thin film layer 3. In a case where N number of thin film layers are stacked on the substrate 2, as the print process (S700) is performed, the conductive material 10b may be printed onto the N thin film layers.

Figure 7B:
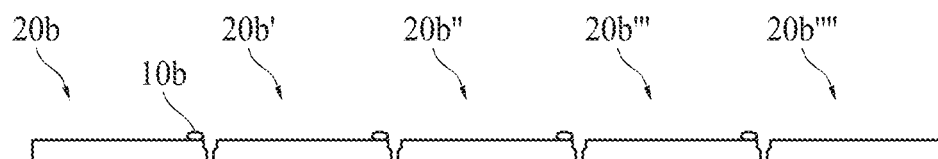
FIG. 7B is a schematic process side view illustrating a cutting process in a method of manufacturing a solar cell according to the present invention.

Referring to FIGS. 2 and 7B, the method of manufacturing the solar cell according to the present invention may include a cutting process (S800).

The cutting process (S800) is a process for dividing the cell 20a into a plurality of unit cells 20b. The cutting process (S800) may be performed after the print process (S700). As illustrated in FIG. 7B, in a case which desires to divide the cell 20a into five unit cells 20b, 20b', 20b'', 20b''', and 20b'''', the method of manufacturing the solar cell according to the present invention may include a four-time cutting process (S800). That is, in a case which desires to divide the cell 20a into M (where M is an integer of 2 or more) number of unit cells 20b, the method of manufacturing a solar cell according to the present invention may include an (M−1)-time cutting process (S800). In a case where N number of thin film layers are stacked on the substrate 2, the cutting process (S800) may be performed by dividing the cell 20a into the unit cells 20b through an $N^{th}$ thin film division part. For example, as illustrated in FIG. 3G, in a case where three thin film layers are stacked on the substrate 2, the cutting process (S800) may be performed by dividing the cell 20a into the unit cells 20b through a cell division part 50. The cell division part 50 may be formed at a corresponding position of the substrate division part 20. The cell division part 50 may be a division part for dividing a substrate, which is for manufacturing a solar cell, into a plurality of pieces. The cutting process (S800) may be performed by a cutting robot (not shown) which divides the cell 20a into the unit cells 20b.

Figure 7C:
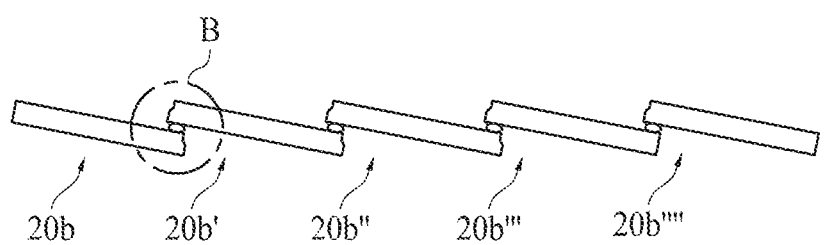
FIG. 7C is a schematic process side view illustrating a solar cell on which a bonding process and a curing process have been performed, in a method of manufacturing a solar cell according to the present invention.

Referring to FIGS. 2 and 7C, the method of manufacturing the solar cell according to the present invention may include a bonding process (S900).

The bonding process (S900) is a process of bonding divided unit cells 20b. The bonding process (S900) may be performed by bonding the divided unit cells 20b by using the conductive material 10b. In a case where the cell 20a is divided into five unit cells 20b, 20b', 20b'', 20b''', and 20b'''' through the cutting process (S800), as illustrated in FIG. 7C, the method of manufacturing a solar cell according to the present invention may include a four-time bonding process (S900). That is, in a case which desires to bond M (where M is an integer of 2 or more) number of unit cells 20b, the method of manufacturing a solar cell according to the present invention may include an (M−1)-time bonding process (S900). The bonding process (S900), as illustrated in FIG. 7C, may include a process of bonding one surface of one side of a first unit cell 20b to the other surface of one side of a second unit cell 20b', a process of bonding one surface of the other side of the second unit cell 20b' to the other surface of one side of a third unit cell 20b", a process of bonding one surface of the other side of the third unit cell 20b" to the other surface of one side of a fourth unit cell 20b''', and a process of bonding one surface of the other side of the fourth unit cell 20b''' to the other surface of one side of a fifth unit cell 20b''''. One side and the other side of each of the unit cells 20b may be disposed at positions opposite to each other with respect to a middle point of the unit cell 20b. The bonding process (S900) may be performed by a transport robot (not shown) which moves the unit cells 20b.

Referring to FIGS. 2 and 7C, the method of manufacturing the solar cell according to the present invention may include a curing process (S1000).

The curing process (S1000) is a process of curing bonded unit cells 20b. The curing process (S1000) may be performed after the bonding process (S900). The curing process (S1000) may be performed by a heating apparatus (not shown) which heats the bonded unit cells 20b. As the curing process (S1000) is performed, a solar cell 10 having a module type where the unit cells 20b are connected to one another may be manufactured. In FIG. 7C, it is illustrated that the solar cell 10 is configured with five unit cells 20b, but this is merely an example and the solar cell 10 may be configured with two or more and four or less unit cells 20b or may be configured with six or more unit cells 20b.

The method of manufacturing the solar cell according to the present invention may include a process of preparing a substrate and a process of forming a thin film.

The process of preparing the substrate may be a process of preparing a substrate 2 where a substrate division part 20 including the first groove 2c and the second groove 2d is formed. The process of preparing the substrate may be performed after the substrate mounting process (S100) and may be performed before the first thin film layer forming process (S500). The process of preparing the substrate may include the first substrate etching process (S200), the second substrate etching process (S300), and the third substrate etching process (S400). The process of preparing the substrate may be performed by the scribing apparatus 1a and the etching apparatus (not shown).

The process of forming the thin film is a process of forming a thin film layer on the substrate 2 with the substrate division part 20 formed therein. The process of forming the thin film may be performed after the process of preparing the substrate. In a case where only the first thin film layer 3 is stacked on the substrate 2, the process of forming the thin film may be implemented to be approximately equal to the first thin film layer forming process (S500). In a case where a plurality of thin film layers are stacked on the substrate 2, the process of forming the thin film may be implemented to be approximately equal to the cell manufacturing process.

A method of manufacturing a solar cell according to a modified embodiment of the present invention may include the substrate mounting process (S100), the first substrate etching process (S200), the second substrate etching process (S300), the third substrate etching process (S400), and a process of forming a cell of a solar cell. The substrate mounting process (S100), the first substrate etching process (S200), the second substrate etching process (S300), and the third substrate etching process (S400) are implemented to be approximately equal to the above description, and thus, a difference will be mainly described below.

The first substrate etching process (S200) may be a process of forming a plurality of in-line groove portions in the top surface of the substrate 2. An in-line groove portion formed by performing the first substrate etching process (S200) may be the substrate division part 20 for dividing the substrate into a plurality of pieces. The first substrate etching process (S200) may be performed after the substrate mounting process (S100). The top surface of the substrate 2 may be the same surface as the one surface 2a of the substrate 2.

The third substrate etching process (S400) may be a process of etching the top surface of the substrate 2 and the plurality of in-line groove portions. The third substrate etching process (S400) may be performed after the first substrate etching process (S200). The third substrate etching process (S400) may be performed by the etching apparatus.

The process of forming the cell of the solar cell may be a process of forming one or more thin film layers on the top surface of the substrate 2. The process of forming the cell of the solar cell may be performed after the third substrate etching process (S400). In a case where only one thin film layer is stacked on the top surface of the substrate 2, the process of forming the cell of the solar cell may be implemented to be approximately equal to the first thin film layer forming process (S500). In a case where a plurality of thin film layers are stacked on the top surface of the substrate 2, the process of forming the cell of the solar cell may be implemented to be approximately equal to the cell manufacturing process.

A method of manufacturing a solar cell according to another modified embodiment of the present invention may include a substrate preparing process, a process of forming a cell of a solar cell, and a division process. The process of forming the cell of the solar cell has described above, and thus, its detailed description is omitted below.

The substrate preparing process may be a process of preparing a substrate 2 where a plurality of in-line groove portions are formed in the top surface of the substrate 2. The substrate preparing process may be the substrate mounting process (S100), the first substrate etching process (S200), and a process of preparing the substrate 2, on which the third substrate etching process (S400) has been performed, in the processing space. The substrate preparing process may be performed after the third substrate etching process (S400).

The division process may be a process of dividing the substrate 2 along the plurality of in-line groove portions. The division process may be performed after the process of forming the cell of the solar cell. The division process may be implemented to be approximately equal to the cutting process (S800).

A method of manufacturing a solar cell according to another modified embodiment of the present invention may include the substrate preparing process, the print process (S700), and the cutting process (S800). The substrate preparing process, the print process (S700), and the cutting process (S800) have described above, and thus, a difference will be mainly described below.

The substrate preparing process may be a process of preparing a substrate where a plurality of in-line groove portions are formed in the top surface of the substrate 2 and a cell of a solar cell is formed. That is, the substrate preparing process may be a process of preparing a substrate where a plurality of in-line groove portions are formed and one or more thin film layers are stacked. The substrate preparing process may be performed after the process of forming the cell of the solar cell.

The print process (S700) may be a process of printing a conductive material 10b onto a periphery of each of the plurality of in-line groove portions. The print process (S700) may be performed after the substrate preparing process.

The cutting process (S800) may be a process of dividing the substrate 2 into two pieces along one of the plurality of in-line groove portions. The cutting process (S800) may be performed after the print process (S700). Each of the two pieces divided by performing the cutting process (S800) may be implemented to be approximately equal to the unit cell 20b.

Hereinafter, a solar cell according to the present invention will be described in detail with reference to the accompanying drawings.

A solar cell 1 according to the present invention generates power by using light energy. The solar cell 1 (illustrated in FIGS. 3E to 3F) according to the present invention may be manufactured by a method of manufacturing a solar cell according to the present invention. The solar cell 1 according to the present invention may be manufactured as the cell manufacturing process is completed.

Referring to FIGS. 3E to 3F, the solar cell 1 according to the present invention may include the substrate 2 and the first thin film layer 3.

The substrate 2 may have a certain conductive polarity. The substrate 2 may be formed of a silicon wafer. The first thin film layer 3 may be stacked on the one surface 2a of the substrate 2. A substrate division part 20 may be formed on the one surface 2a of the substrate 2. The substrate division part 20 may have a size which is progressively reduced in the downward direction. The substrate division part 20 may be formed by performing the first substrate etching process (S200).

The first thin film layer 3 is formed on the substrate 2. The first thin film layer 3 may be stacked on the one surface 2a of the substrate 2. A first division member 31 included in the first thin film layer 3 may be inserted into the substrate division part 20. The first division member 31 may be formed in a shape corresponding to the substrate division part 20. For example, the first division member 31 may be formed so that a size thereof is progressively reduced in the downward direction. The first division member 31 may be formed by performing the first thin film layer forming process (S500).

Hereinabove, it has been described that the solar cell 1 according to the present invention includes the substrate 2 and the first thin film layer 3, but this is merely an example and the solar cell 1 according to the present invention may include the substrate 2 and two thin film layers 3 and 4 as illustrated in FIG. 3F or may include the substrate 2 and three thin film layers 3 to 5 as illustrated in FIG. 3G.

Hereinafter, an embodiment where a plurality of thin film layers are formed on the substrate 2 in the solar cell 1 according to the present invention will be described in detail with reference to the accompanying drawings.

Figure 6A:
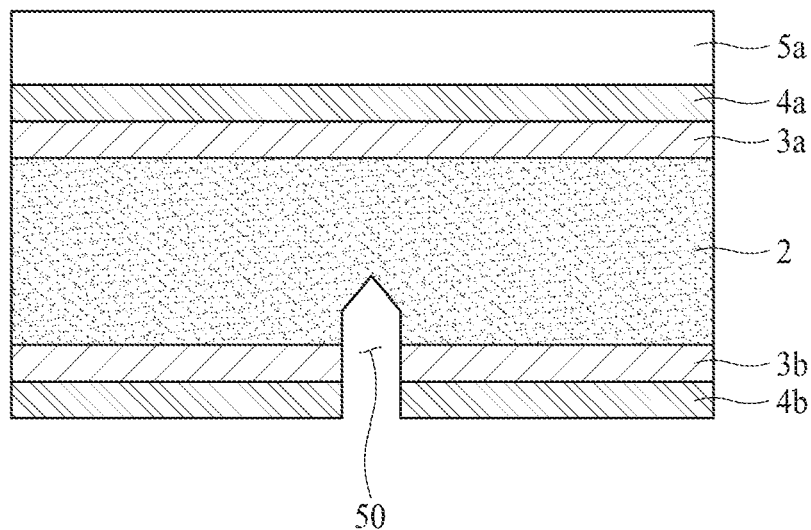
FIGS. 6A and 6B are schematic front cross-sectional views illustrating an embodiment where a plurality of thin film layers are formed on a substrate, in a solar cell according to the present invention.
Figure 6B:
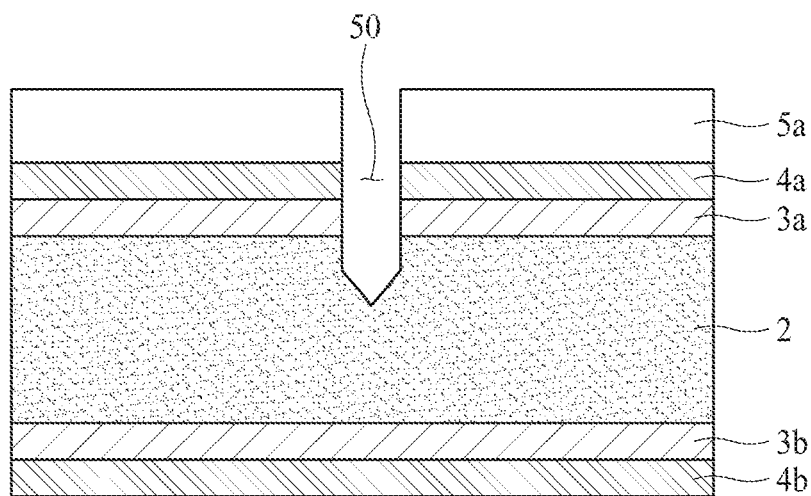

Referring to FIGS. 6A and 6B, the solar cell 1 according to the present invention may include the substrate 2, an N-type semiconductor layer 3a stacked on the top surface of the substrate 2, a first TCO layer 4a stacked on the N-type semiconductor layer 3a, a perovskite layer 5a stacked on the first TCO layer 4a, a P-type semiconductor layer 3b stacked on the bottom surface of the substrate 2, and a second TCO layer 4b stacked on the P-type semiconductor layer 3b. In this case, the cell division part 50 may be formed on the bottom surface of the substrate 2. Therefore, comparing with an example where the cell division part 50 is formed on the top surface of the substrate 2, the solar cell 1 according to the present invention may implement a preventive force which prevents a perovskite material, a TCO material, and an N-type semiconductor material from flowing into the cell division part 50 due to gravity as the scribing process is performed.

Hereinafter, a solar cell according to an embodiment of the present invention will be described with reference to the accompanying drawings.

Figure 8:
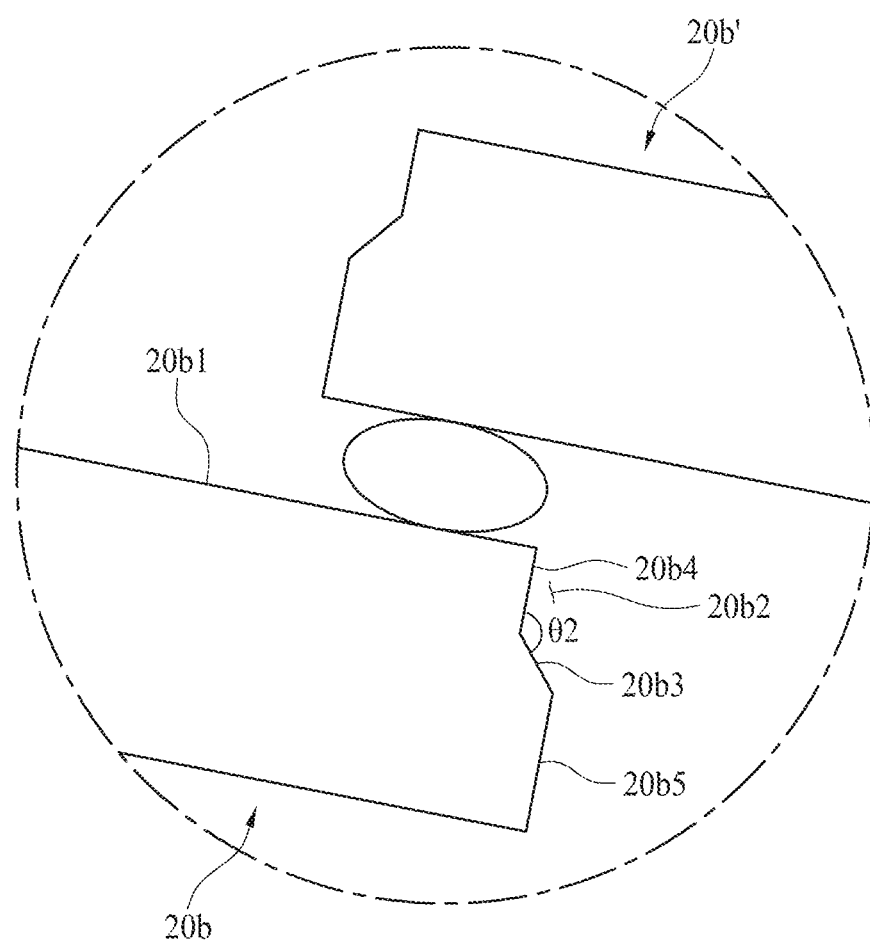
FIG. 8 is an enlarged view of a portion B of FIG. 7C.

Referring to FIGS. 7C and 8, a solar cell 10 (illustrated in FIG. 7C) according to an embodiment of the present invention may be manufactured by a method of manufacturing a solar cell according to the present invention. The solar cell 10 according to an embodiment of the present invention may be manufactured as the curing process (S1000) is completed. The solar cell 10 according to an embodiment of the present invention may be implemented as a module type where the unit cells 20b are connected to one another. Hereinafter, each of a plurality of unit cells 20b included in the solar cell 10 according to an embodiment of the present invention will be described in detail with reference to the accompanying drawings.

Referring to FIG. 8, each of the unit cells 20b may include a cell top surface 20b1, a cell cross-sectional groove 20b2, a first cross-sectional surface 20b3, a second cross-sectional surface 20b4, and a third cross-sectional surface 20b5.

The cell top surface 20b1 is disposed in the upward direction. The cell top surface 20b1 may correspond to one surface of the unit cell 20b disposed in the upward direction. The conductive material 10b may be printed onto the cell top surface 20b1. In a case where N number of thin film layers are stacked on the substrate 2, the cell top surface 20b1 may be the same surface as one surface of an $N^{th}$ thin film layer.

The cell cross-sectional groove 20b2 is formed by dividing the cell 20a into a plurality of unit cells 20b. The cell cross-sectional groove 20b2 may be a portion of the cell division part 50. The cell cross-sectional groove 20b2 is formed in the cell top surface 20b1. The cell cross-sectional groove 20b2 may be recessed from the cell top surface 20b1 by a certain depth. The cell cross-sectional groove 20b2 may be implemented as a groove having a size which is progressively reduced as progressively extending in the downward direction.

The first cross-sectional surface 20b3 is disposed to face the cell cross-sectional groove 20b2. The first cross-sectional surface 20b3 may be connected to the second cross-sectional surface 20b4. A corner may be formed at a portion at which the first cross-sectional surface 20b3 is connected to the second cross-sectional surface 20b4. The first cross-sectional surface 20b3 may be disposed to be inclined with respect to the cell top surface 20b1. The first cross-sectional surface 20b3 may be connected to each of the second cross-sectional surface 20b4 and the third cross-sectional surface 20b5.

The second cross-sectional surface 20b4 is connected to each of the first cross-sectional surface 20b3 and the cell top surface 20b1. An included angle θ2 (illustrated in FIG. 8) between the second cross-sectional surface 20b4 and the first cross-sectional surface 20b3 may be less than 180 degrees. The second cross-sectional surface 20b4 may be disposed to be inclined with respect to each of the first cross-sectional surface 20b3 and the cell top surface 20b1. A corner may be formed at a portion at which the second cross-sectional surface 20b4 is connected to the cell top surface 20b1. An included angle between the second cross-sectional surface 20*b*4 and the cell top surface 20*b*1 may be about 90 degrees.

The third cross-sectional surface 20*b*5 is connected to the first cross-sectional surface 20*b*3 and a cell bottom surface. The third cross-sectional surface 20*b*5 may be formed by dividing the cell 20*a* into the unit cells 20*b*. The third cross-sectional surface 20*b*5 may be formed of a plane. The cell bottom surface may correspond to the other surface of the unit cell 20*b* disposed in the downward direction. A corner may be formed at a portion at which the third cross-sectional surface 20*b*5 is connected to the first cross-sectional surface 20*b*3. The third cross-sectional surface 20*b*5 may be disposed to be inclined with respect to each of the first cross-sectional surface 20*b*3 and the cell bottom surface. A corner may be formed at a portion at which the third cross-sectional surface 20*b*5 is connected to the cell bottom surface.

Hereinafter, a substrate 2 for solar cells according to the present invention will be described in detail with reference to the accompanying drawings.

Referring to FIGS. 5A to 5D, the substrate 2 for solar cells according to the present invention is formed as the first substrate etching process (S200) is performed before the third substrate etching process (S400) is performed. The substrate 2 for solar cells according to the present invention may include a substrate body, a first groove 2*c*, a second groove 2*d*, and a damage prevention part 2*f*.

The substrate body has a certain conductive polarity. The substrate body may function as a main body of the substrate 2 for solar cells according to the present invention. The substrate body may form a wholly external appearance of the substrate 2 for solar cells according to the present invention.

The first groove 2*c* is formed in the substrate body. The first groove 2*c* may be formed by etching one surface 2*a* of the substrate body by a certain depth. The first groove 2*c* may be formed in a wholly rectangular shape. The first groove 2*c* may be formed by performing the first substrate etching process (S200).

The second groove 2*d* is formed at an inner portion of the first groove 2*c*. That is, the second groove 2*d* may communicate with the first groove 2*c*. The second groove 2*d* is for enlarging an etching surface 2*e* facing the first groove 2*c*. Therefore, the substrate 2 for solar cells according to the present invention may enlarge the etching surface 2*e* having a cross-sectional surface which is better in quality than the substrate cross-sectional surface 2*g*, thereby enhancing the total quality of a finished solar cell. The second groove 2*d* may be formed in a wholly rectangular shape. The second groove 2*d* may be formed by performing the second substrate etching process (S300).

The damage prevention part 2*f* is formed to be stepped with respect to the etching surface 2*e* and is formed with the second groove 2*d* being disposed inward therefrom. The damage prevention part 2*f* may limit the enlargement of the etching surface 2*e*, thereby realizing a preventive force which prevents the substrate 2 for solar cells according to the present invention into a plurality of pieces. Accordingly, the substrate 2 for solar cells according to the present invention may decrease in possibility of damage of the substrate 2 even when a physical impact such as collision between the substrate 2 and a process apparatus installed in the processing space occurs, thereby enhancing process stability in manufacturing a solar cell.

The damage prevention part 2*f* may be formed to have a size which is less than that of the second groove 2*d*, with respect to a scribing direction in which the first groove 2*c* is formed. That is, the second groove 2*d* may be formed to have a size which is greater than that of the damage prevention part 2*f*, with respect to the scribing direction. Accordingly, the substrate 2 for solar cells according to the present invention may increase an enlargement region of the etching surface 2*e*.

The damage prevention part 2*f* may be formed to have a second thickness L2 (illustrated in FIGS. 5B and 5C) having a value corresponding to ½ or more of a first thickness L1 (illustrated in FIGS. 5B and 5C) of the substrate body and having a value which is equal to or less than the first thickness L1. Therefore, the substrate 2 for solar cells according to the present invention may be implemented to sufficiently secure a preventive force which prevents the substrate 2 from being divided into a plurality of pieces. The thickness may be a direction which is parallel to a direction, in which a height of the substrate 2 for solar cells according to the present invention increases or decreases wholly, and is vertical to the scribing direction. The second thickness L2 may have a value corresponding to 70% or more of the first thickness L1. In this case, a third thickness L3 (illustrated in FIGS. 5B and 5C) between the damage prevention part 2*f* and the one surface 2*a* of the substrate 2 may have a value corresponding to 30% or less of the first thickness L1. The damage prevention part 2*f* may be formed to protrude from the etching surface 2*e*.

The damage prevention part 2*f* may include a first prevention member 2*f*1, a second prevention member 2*f*2, and a connection member 2*f*3.

The first prevention member 2*f*1 is formed to be stepped with respect to the etching surface 2*e*. The first prevention member 2*f*1 may be formed at one side with respect to the second groove 2*d* and may prevent the damage of the substrate 2 for solar cells according to the present invention. The first prevention member 2*f*1 may be formed in a wholly rectangular shape.

The second prevention member 2*f*2 is formed at a position apart from the first prevention member 2*f*1. The second prevention member 2*f*2 may be formed to be stepped with respect to the etching surface 2*e*. The second prevention member 2*f*2 may be formed at the other side with respect to the second groove 2*d* and may prevent the damage of the substrate 2 for solar cells according to the present invention. The second prevention member 2*f*2 may be formed in a wholly rectangular shape.

The connection member 2*f*3 is connected to each of the first prevention member 2*f*1 and the second prevention member 2*f*2. The second groove 2*d* may be disposed at an inner portion with respect to the connection member 2*f*3, the second prevention member 2*f*2, and the first prevention member 2*f*1. The connection member 2*f*3 may be formed in a wholly rectangular shape.

The connection member 2*f*3 may be connected to each of the first prevention member 2*f*1 and the second prevention member 2*f*2 to be stepped therefrom. For example, each of an included angle between the connection member 2*f*3 and the first prevention member 2*f*1 and an included angle between the connection member 2*f*3 and the second prevention member 2*f*2 may be 90 degrees. The connection member 2*f*3 may be connected to each of the first prevention member 2*f*1 and the second prevention member 2*f*2 to form a curve surface.

The present invention described above are not limited to the above-described embodiments and the accompanying drawings and those skilled in the art will clearly appreciate that various modifications, deformations, and substitutions are possible without departing from the scope and spirit of the invention.

The invention claimed is:

1. A method of manufacturing a solar cell where a division part for dividing a substrate, which is for manufacturing the solar cell, into a plurality of pieces is formed, the method comprising:
   a process of preparing the substrate;
   a first substrate etching process of forming a first groove in one surface of the substrate;
   a second substrate etching process of forming a second groove in the first groove;
   a third substrate etching process of etching the substrate including the second groove;
   a solar cell forming process including a first thin film layer forming process of forming a first thin film layer on the substrate, the solar cell forming process being performed after the third substrate etching process; and
   a division process of dividing the substrate along the division part, the division process being performed after the solar cell forming process,
   wherein the division part comprises the first groove and the second groove.

2. The method of claim 1, wherein
   the first substrate etching process is a process of forming an N-type semiconductor layer on a top surface of the substrate and forming a P-type semiconductor layer on a bottom surface of the substrate, and
   each of the first substrate etching process, the second substrate etching process, and the third substrate etching process is performed on the bottom surface of the substrate.

3. The method of claim 1, wherein the third substrate etching process comprises a process of forming a substrate division part at a position at which the first groove is formed.

4. The method of claim 3, wherein the substrate division part is formed so that a size thereof is progressively reduced in a downward direction.

5. The method of claim 3, wherein the process of forming the substrate division part comprises a process of forming a first division surface facing the substrate division part.

6. The method of claim 5, wherein the first division surface is formed to be inclined with respect to the one surface of the substrate.

7. The method of claim 5, wherein
   the process of forming the substrate division part further comprises a process of forming a second division surface connected to the first division surface, and
   a corner is formed at a connection point at which the second division surface is connected to the first connection surface.

8. The method of claim 5, wherein
   the process of forming the substrate division part further comprises a process of forming a first connection surface connected to each of the first division surface and the one surface of the substrate, and
   an included angle between the first connection surface and the first division surface is formed to 180 degrees or less.

9. The method of claim 3, wherein the first thin film layer forming process comprises a process of forming a first division member inserted into the substrate division part.

10. The method of claim 1,
    wherein the first substrate etching process is a scribing process using a laser, and
    wherein the third substrate etching process is a wet etching process.

11. The method of claim 1, wherein
    the second substrate etching process is a process of forming the second groove communicating with the first groove, for enlarging an etching surface facing the first groove, and
    a damage prevention part stepped with respect to the etching surface is formed by performing the second substrate etching process.

12. The method of claim 1, wherein
    the first groove is formed to have a first depth from the one surface of the substrate,
    the second groove is formed to have a second depth from the one surface of the substrate, and
    the second depth is formed to be greater than the first depth.

13. The method of claim 1, wherein
    the first groove is formed to have a first length with respect to a first direction from the one surface of the substrate to the other surface of the substrate,
    the second groove is formed to have a second length with respect to the first direction, and
    the second length is formed to be shorter than the first length.

* * * * *